(12) United States Patent
Korec et al.

(10) Patent No.: US 7,186,609 B2
(45) Date of Patent: Mar. 6, 2007

(54) METHOD OF FABRICATING TRENCH JUNCTION BARRIER RECTIFIER

(75) Inventors: Jacek Korec, San Jose, CA (US); Richard K. Williams, Cupertino, CA (US)

(73) Assignee: Siliconix incorporated, Santa Clara, CA (US)

( * ) Notice: Subject to any disclaimer, the term of this patent is extended or adjusted under 35 U.S.C. 154(b) by 0 days.

(21) Appl. No.: 10/146,539

(22) Filed: May 14, 2002

(65) Prior Publication Data

US 2002/0125541 A1    Sep. 12, 2002

Related U.S. Application Data

(62) Division of application No. 09/476,389, filed on Dec. 30, 1999, now abandoned.

(51) Int. Cl.
*H01L 21/8238* (2006.01)

(52) U.S. Cl. ........................... 438/221; 257/510

(58) Field of Classification Search ................ 438/273, 438/140, 92, 167, 570, 268, 221–225, 296, 438/353, 404; 257/471, 403, 335, 337, 510–524, 257/472
See application file for complete search history.

(56) References Cited

U.S. PATENT DOCUMENTS

| 4,819,052 | A |   | 4/1989  | Hutter |         |
|-----------|---|---|---------|--------|---------|
| 4,982,260 | A |   | 1/1991  | Chang  |         |
| 5,241,195 | A | * | 8/1993  | Tu et al. | ............ 257/155 |
| 5,365,102 | A |   | 11/1994 | Mehrotra |       |
| 5,488,236 | A |   | 1/1996  | Baliga |         |
| 5,631,484 | A | * | 5/1997  | Tsoi et al. | .......... 257/341 |
| 5,679,966 | A |   | 10/1997 | Baliga |         |
| 5,786,619 | A | * | 7/1998  | Kinzer | .......... 257/403 |
| 6,127,226 | A | * | 10/2000 | Lin et al. | ........ 438/259 |
| 6,174,773 | B1 | * | 1/2001 | Fujishima | ....... 438/270 |
| 6,191,447 | B1 |   | 2/2001 | Baliga |         |
| 6,204,097 | B1 | * | 3/2001 | Shen et al. | ....... 438/133 |
| 6,355,508 | B1 | * | 3/2002 | Porter et al. | ..... 438/140 |
| 6,583,010 | B2 | * | 6/2003 | Mo     | .......... 438/270 |
| 6,689,662 | B2 | * | 2/2004 | Blanchard | ....... 438/268 |

FOREIGN PATENT DOCUMENTS

| EP | 93202247    |   | 2/1994 |
|----|-------------|---|--------|
| JP | 06151734 A  | * | 5/1994 |

* cited by examiner

*Primary Examiner*—Nathan W. Ha
(74) *Attorney, Agent, or Firm*—Silicon Valley Patent Group LLP

(57) ABSTRACT

A Schottky rectifier includes a rectifying interface between a semiconductor body and a metal layer. Trenches are formed in the surface of the semiconductor body and regions of a conductivity type opposite to the conductivity type of the body are formed along the sidewalls and bottoms of the trenches, the regions forming PN junctions with the rest of the body. When the rectifier is reverse-biased, the depletion regions along the PN junctions merge to occupy the entire width of the mesas. The device is fabricated by implanting dopant directly through the sidewalls and bottoms of the trenches, by filling the trenches with a material containing dopant and causing the dopant to diffuse through the sidewalls and bottoms of the trenches, or by implanting and diffusing the dopant into a gate filling material.

24 Claims, 10 Drawing Sheets

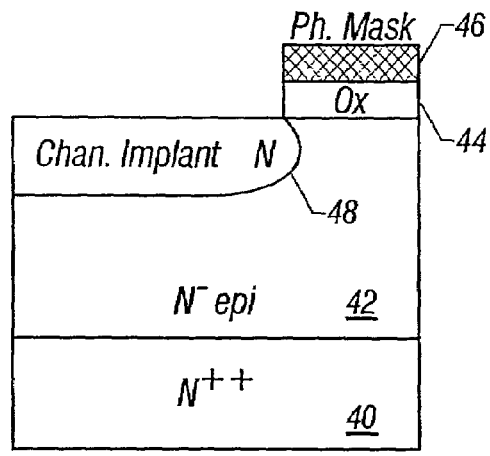
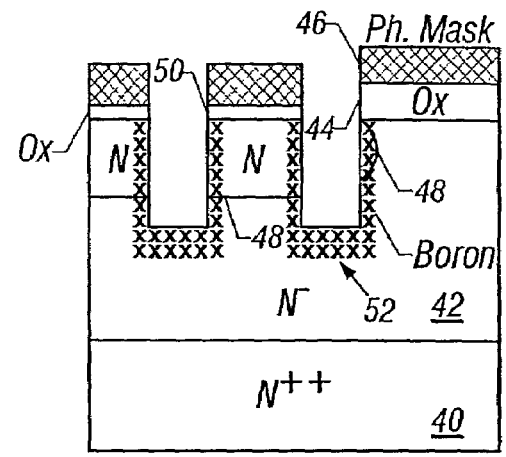
FIG. 13A    FIG. 13B
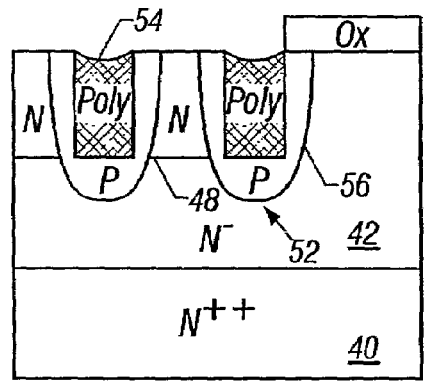
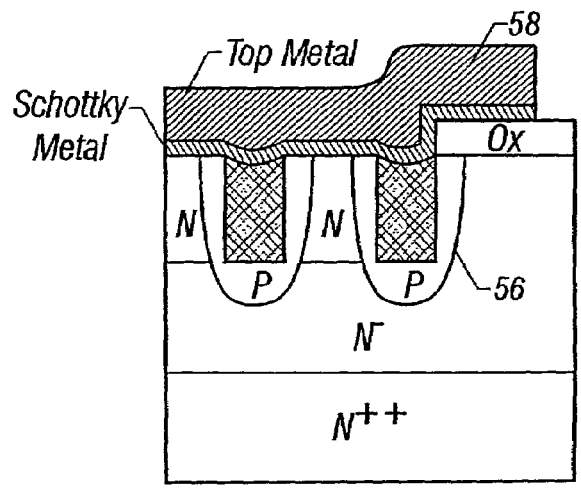
FIG. 13C    FIG. 13D

METHOD OF FABRICATING TRENCH JUNCTION BARRIER RECTIFIER

REFERENCE TO RELATED APPLICATION

This application is a divisional of application Ser. No. 09/476,389, filed Dec. 30, 1999, abandoned.

This application is related to application Ser. No. 08/832,012 filed Apr. 2, 1997, which is incorporated herein by reference in its entirety.

FIELD OF THE INVENTION

This invention relates to rectifiers and more specifically to metal-semiconductor rectifying devices, and to methods of fabricating these devices.

BACKGROUND OF THE INVENTION

Schottky diodes are employed as rectifiers in numerous power and small signal applications where the forward conduction or switching characteristics of the diode are important. Conventional silicon PN-junction diodes have a number of disadvantages, including: (i) a large voltage drop of approximately 700 mV or more, depending on the operating current density when the diode is in its forward conducting state, and (ii) the diode's characteristic of storing a large number of minority carriers when it is in the forward-conducting condition, which slows the diode's turn off time and leads to numerous problems relating to diode reverse recovery such as increased power loss, heating, noise and reduced circuit efficiencies.

Fast recovery times are achieved in high voltage PIN diodes by reducing minority carrier lifetime through irradiation or platinum doping and in low voltage applications (below 100V) using a metal-silicon Schottky barrier diode instead of a PN junction. At low voltages, the Schottky diode is preferable to the PN junction diode because of its lower voltage drop.

A major disadvantage of the Schottky diode is its relatively high offstate leakage current, which is typically orders of magnitude higher than the leakage current of a PN junction diode. Moreover, the leakage current in a Schottky diode is strongly dependent on the applied reverse voltage, as a consequence of reverse-voltage-induced-barrier-lowering at the rectifying metal-semiconductor interface, sometimes referred to as the "Schottky interface" or "Schottky contact".

The offset leakage current is a strong function of the Schottky barrier height, which can be influenced by the choice of the metal forming the contact to the semiconductor. Metal electrodes with a higher work function, resulting in a higher Schottky barrier height, show a lower leakage current. However, a higher Schottky barrier leads to a larger forward-voltage drop, which varies linearly with the barrier height.

The barrier-lowering which has a dominant effect on the leakage current at high reverse voltages is itself a function of the value of the electric field peak appearing at the Schottky interface. The value of the peak electric field in turn is a strong function of the doping level of the semiconductor, and increases with increasing doping concentration. As a result, conventional planar Schottky diodes are over-designed in the sense of using a doping concentration in the semiconductor that is too low for the requested blocking voltage. In the end, a lower doping of the semiconductor means a larger serial resistance of this region and a larger forward voltage drop of the device.

Thus an important issue in the design of a Schottky diode is the optimization of the trade-off between the voltage drop in the conducting state and the leakage current in a reverse-bias condition. Many of the inventions for improving the performance of this device are focused on a reduction of the electric field at the Schottky interface and introduce device structures which allow avalanche breakdown to occur far away from the Schottky contact.

An early attempt to reduce the trade-off between forward and reverse currents is the junction-barrier-controlled Schottky (JBS) rectifier as described in U.S. Pat. No. 4,641,174 to Baliga et al., shown in cross-section in FIG. 1. The JBS rectifier is a merged Schottky/PN diode having a PN junction grid interspersed between the Schottky contacts. The PN junction grid is designed to deplete the Schottky channel regions under reverse bias conditions, but not to pinch-off these channels to forward conduction current.

The purpose of the PN grid is to change the electric field distribution within a reverse-biased device in a way that the Schottky contacts are shielded against high electric peak values and breakdown occurs at the bottoms of the P-wells. The dimensions of the grid and the doping levels are such that the depletion layers extending from the PN junctions into the substrate merge under the Schottky contacts when the reverse bias exceeds a few volts. Any further increase of the reverse-bias voltage is supported by the depletion layers of the PN junctions, away from the Schottky interface. The efficiency of the shielding of the Schottky interface by the described mechanism depends on the aspect ratio Tc/Wc of the channels. However, the implantation and diffusion of the PN junctions leads to a significant loss of the Schottky contact area and does not allow high aspect ratios (Tc/Wc) because of the lateral diffusion of the P-type dopant. For these reasons, the JBS concept has not been used for commercial products.

An attempt to develop the JBS concept can be found in U.S. Pat. No 4,982,260 to Chang et al. The proposed improvements of the usage of the active area of the device and an attempt to increase the Tc/Wc aspect ratio of the channel are sketched in FIGS. 2 and 3. In the device from FIG. 2 the lateral diffusion of the PN junctions is limited by MOS trench regions. However, it can be clearly seen, that this concept does not improve the usage of the active area of the device in a significant manner. Another embodiment shown in FIG. 3 includes PN junctions formed at the bottom of MOS trench regions. Here, the proposed device structure requires a very complex and expensive technology, which is prohibitive for large volume products.

A simplification of the structure of FIG. 3 is described in U. S. Pat. No. 5,365,102 to Mehrotra and Baliga, and is presented in FIG. 4 in this application. In this device the PN junctions have been replaced by a grid of trenches with a MOS gate. For an appropriate doping and width Wm of the mesa regions, the MOS trenches are efficient enough to shield the Schottky contacts and allow the design of conducting channels having a high aspect ratio. This trench-gated Schottky diode fulfills the design requirements from the point of view of the optimization of the forward voltage drop at reduced leakage currents. However, this concept disregards the problems caused by the generation of "hot" minority carriers at the bottom of the trench in avalanche breakdown conditions. The minority carriers generated during avalanche breakdown can have a kinetic energy high enough to be injected into the gate oxide. An accumulation of injected hot carriers impairs the gate oxide and in time can permanently damage the device. Such devices have no energy absorbing capability for avalanche surge currents.

An avalanche rugged, trench-gated Schottky diode is described in the above-referenced application Ser. No. 08/832,012 to Williams et al. A device designed according to this concept is sketched in FIG. 5. It includes a grid of MOS trenches separating mesa regions with Schottky contacts and integrated clamping PN diodes which have a lower breakdown voltage than the trench structure. An epitaxial layer with a stepped or graded doping profile is preferred. It should be noted that the definition of a specific breakdown voltage of the device and the requirement of a lower doping in the vicinity of the MOS trench may not allow a free optimization of the doping of the channel mesa regions.

What is needed is a Schottky diode structure minimizing the barrier lowering effect, integrating an avalanche rugged PN clamping diode, and allowing an easy fabrication.

SUMMARY OF THE INVENTION

According to this invention, a trench junction barrier rectifier comprises a semiconductor body generally of a first conductivity type having first and second trenches formed at a surface of the body, the first and second trenches defining a mesa located between the first and second trenches; a first region of a second conductivity type extending along a sidewall of the first trench and into the mesa; a second region of the second conductivity type extending along a sidewall of the second trench and into the mesa, the first and second regions forming first and second PN junctions, respectively, with a third region of the first conductivity type in the mesa; and a metal layer forming a rectifying interface with at least a portion of a top surface of the mesa.

In one embodiment, a Schottky diode is formed in a semiconductor body that includes an N-type epitaxial layer deposited over an N+ substrate, the surface of the epitaxial layer forming the surface of the semiconductor body. The diode includes first and second trenches formed at the surface of the semiconductor body, the trenches being separated by a mesa. The walls and the bottoms of the trenches are doped with atoms of P-type conductivity, creating a P-type region which forms a PN junction with the N-type portions of the mesa and the semiconductor body below. In this embodiment, the trenches are filled with polysilicon that is doped with P-type atoms. In this way, the polysilicon forms one of the electrodes of the PN junction.

To ensure good electrical performance of the diode, the area consumed by the trenches and by the lateral diffusion of the PN junction should be minimized. In a preferred fabrication method, the region of second conductivity type adjoining the trenches is formed by a diffusion of boron atoms from boron doped polysilicon into the side walls and into the bottom of the trench. The polysilicon itself can be doped in-situ during the deposition in a chemical vapor deposition (CVD) process, or the polysilicon can be doped by implantation. In the case of the implanted polysilicon, the choice of the fabrication method plays an important role.

In a preferred fabrication method, the trench is filled with polysilicon and the polysilicon is etched back. After etchback, the surface of the polysilicon is at a level below the surface of an oxide layer overlying the mesas and above of the surface of the semiconductor body. Boron atoms are then implanted into the polysilicon, using the oxide layer as a mask. By using $BF_2$ as a source of boron atoms, the lateral diffusion of boron along the semiconductor surface can be minimized. After the dopant is activated in a annealing step with the thermal budget no greater than 30 minutes at 1050° C., the oxide layer is removed, and a metal layer is deposited on the surface of the mesa, forming a rectifying (Schottky) barrier at the surface of the mesa. When the Schottky diode is forward-biased, a current flows vertically through the mesa, the region conducting the current being called a channel.

In order to ensure an energy-absorbing capability for avalanche surge currents, a clamping diode can be formed at a PN junction between a region of first conductivity type in the semiconductor body and a diffusion of second conductivity type. The clamping diode is fabricated in parallel with the current path through the mesa and is designed to experience avalanche breakdown at a reverse voltage which is lower (in absolute value) than the reverse voltage at which the Schottky contact breaks down. In a preferred embodiment, the clamping diode is formed by the PN junction adjacent the polysilicon-filled trenches and acts as a clamping diode distributed uniformly across the entire active area of the device.

The metal forming the Schottky contact may extend trench-to-trench across the entire width of the mesa, or it may be limited to a portion of the width of the mesa by a contact mask. The Schottky metal may coat the entire device or be defined locally by a separate mask. The Schottky metal may be any metal that forms a Schottky barrier with a medium- or lightly-doped semiconductor and is preferably a metal that forms a non-rectifying or only slightly rectifying contact with heavily-doped regions such as the diffusion which forms the clamping diode or the heavily-doped polysilicon filling the trenches. Examples of acceptable Schottky metals include titanium, molybdenum, tungsten, platinum and their silicide compounds. The Schottky metal may be coated with another metal such as aluminum or any top metal. The top metal may be likewise be formed of a sandwich construction.

The doping of the channel region between the trenches and the doping of the epitaxial layer between the trench bottoms and the heavily-doped substrate, called a "drift" region, may be designed independently. In one embodiment, the doping concentration of the epitaxial layer is made non-uniform by the deposition of a multilayer structure with varying resistivity. In another embodiment, the doping concentration of the channel region is defined by an implantation of dopant atoms into the active area of the device restricted by an implantation mask.

The trenches are designed as a grid defining a plurality of mesas or diode cells arrayed in a lattice arrangement of stripes, squares, rectangles, hexagons, or any other polygons.

This invention also includes apparatus and methods for fabricating such voltage-clamped trench-junction-barrier Schottky diodes. A process of fabricating a trench junction barrier rectifier in accordance with this invention comprises providing a semiconductor body of a first conductivity type; etching at least two trenches in a surface of the semiconductor body, leaving a mesa between the trenches, each of the trenches having a sidewall and a bottom; introducing atoms of a second conductivity type into a first region of the semiconductor body adjacent the sidewall and bottom of each of the trenches, leaving a second region of the mesa with a first conductivity type so as to form a PN junction between the first and second regions; and depositing a metal layer on a surface of the mesa.

BRIEF DESCRIPTION OF THE DRAWINGS

The present invention will be described now in more detail with reference to the following drawings.

FIGS. 13A–13D are cross-sectional views illustrating a process sequence in which dopant is implanted through the sidewalls and bottoms of the trenches.

DESCRIPTION OF THE INVENTION

As described above, an object of this invention is to provide a Schottky diode structure minimizing the barrier lowering effect, integrating an avalanche-rugged PN clamping diode, and allowing easy fabrication.

Figure 6:
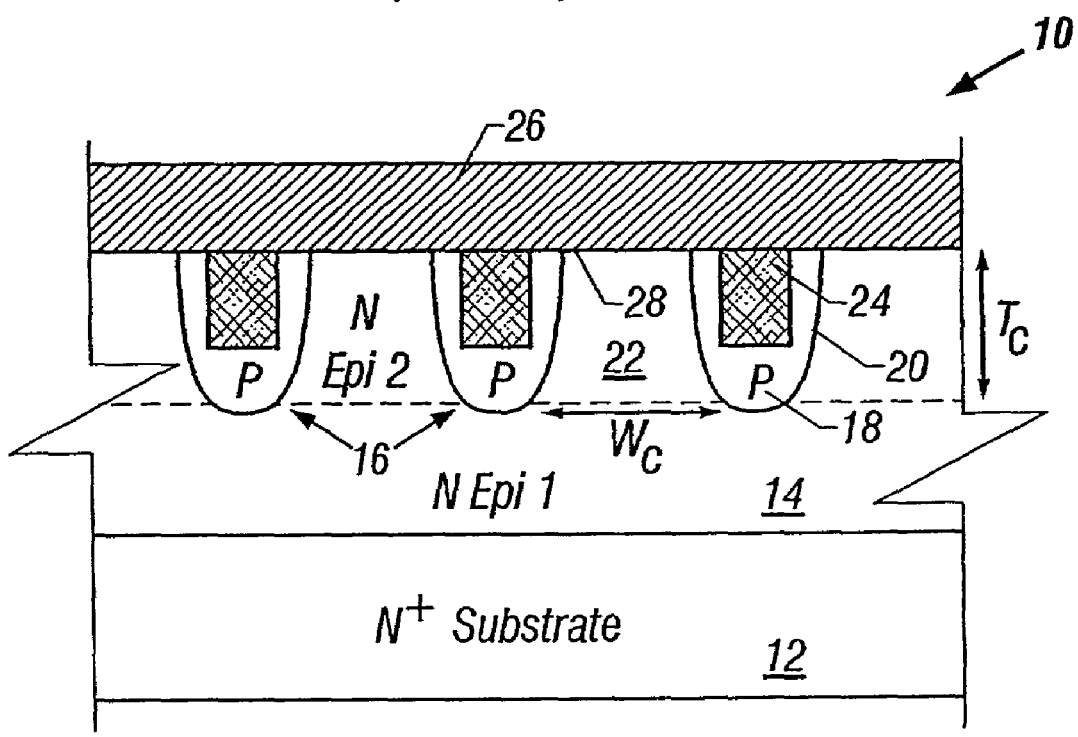
FIG. 6 is a cross-sectional view of a Schottky junction barrier rectifier according to the invention.

An embodiment according to this invention is shown in FIG. 6, which shows a trench junction barrier Schottky diode 10. Schottky diode 10 is formed in an N+ silicon substrate 12, on which an N-epitaxial (epi) layer 14 is grown. Epi layer 14 is subdivided into two layer, designated Nepi$_1$ and Nepi$_2$, each of which has a different doping concentration of N-type atoms. Trenches 16 are formed in the top surface of epi layer 14. A P-type region 18 is formed adjacent each of trenches 16, and region 18 forms a PN junction 20 with the N-type portions of epi layer 14. Trenches 16 are separated by mesas 22 and are filled with polysilicon 24. The top surface of polysilicon 24 is approximately coplanar with the top surfaces of the mesas 22. A metal layer 26, formed of a Schottky metal such as titanium, overlies epi layer 14 and forms a Schottky interface or contact 28 with epi layer 14. When the diode 10 is forward-biased a current flows vertically between N+ substrate 12 and metal layer 26, through a channel of each of mesas 22.

The doping and the width of the mesas 22 are designed so that, when the device is forward-biased, the channel between the trenches 16 is not pinched-off by the depletion layers extending from the PN junctions 20 along the walls of the trenches. Under reverse bias conditions, however, the depletion layers merge and shield the Schottky contact 28 against a high electric field. In this way, the effect of the reverse-voltage-induced-barrier-lowering is suppressed. This results in a superior, flat reverse-current characteristic. In a preferred embodiment, the PN junctions 20 embedding the polysilicon filled trenches 16 form a clamping diode which defines the localization of the breakdown of the device and drains the surge current under avalanche conditions.

Since the built-in potential barrier at the PN junction 20 in the clamping diode is greater than the forward voltage drop across the rectifying Schottky interface 28, the bias across the PN junction 20 is not large enough to cause an injection of minority carriers when the device is in conducting state, and practically no charge is stored in the clamping diode. This avoids the reverse recovery problems inherent in conventional PN diodes.

Thus, in effect the diode formed at the rectifying Schottky interface 28 "clamps" the clamping diode represented by the PN junction 20 when the device is forward-biased, and the clamping diode at the PN junction 20 clamps the Schottky interface 28 when the device is reverse-biased.

The performance of the trench-junction-barrier Schottky diode depends on several design and process criteria, including: geometry, dopant profiles, clamping diode implementation, termination and packaging. Geometry issues defining the device layouts suitable for trench Schottky diodes are addressed in the above-mentioned U.S. Pat. No. 5,365,102 and in the above-referenced patent application Ser. No. 08/832,012, both of which are incorporated herein by reference. Also the design criteria for the definition of the doping profile in the epitaxial layer are discussed in detail in the patent application Ser. No. 08/832,012.

Figure 7A:
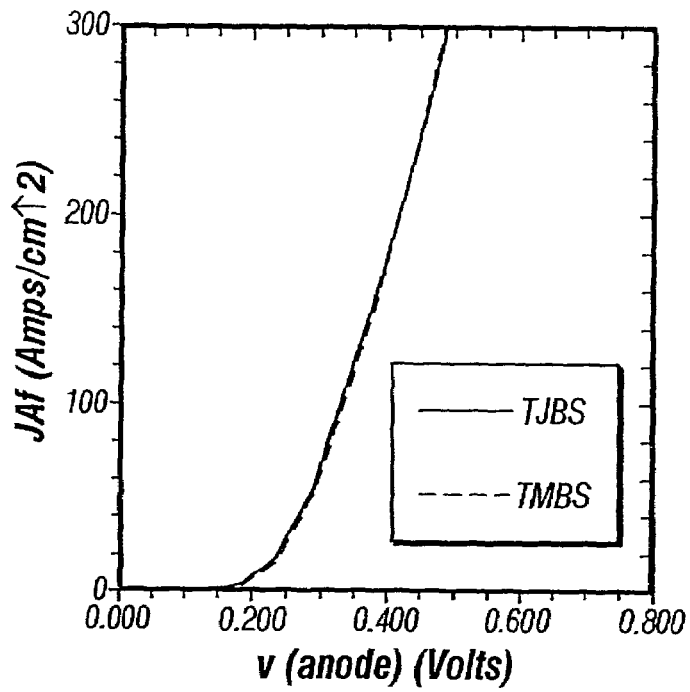
FIGS. 7A and 7B are graphs showing the current-voltage characteristics of the device shown in FIG. 6.
Figure 7B:
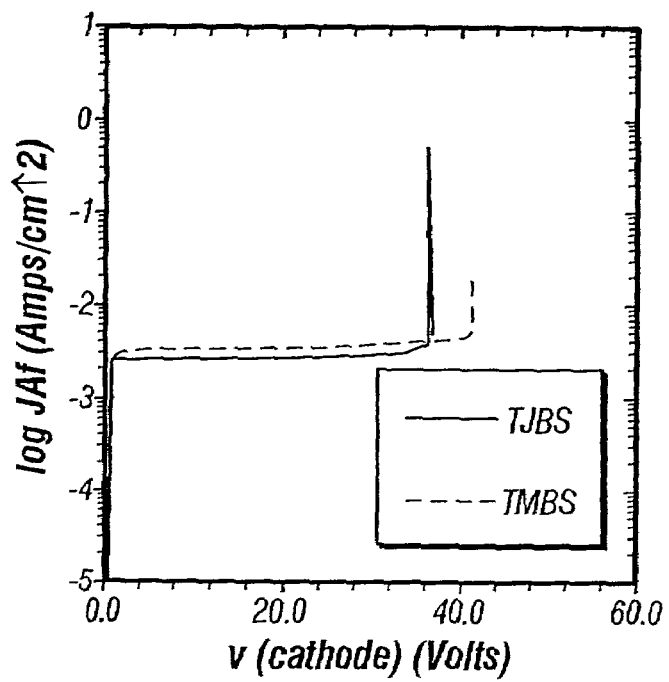

To investigate the performance of a trench-junction-barrier Schottky (TJBS) diode as shown in FIG. 6, we compared simulation results obtained by calibrated MEDICI 2D calculations performed for a diode designed according to this invention with the results obtained earlier for a trench-gated-MOS-barrier Schottky (TMBS) diode of the kind described in the above-reference application Ser. No. 08/832,012. Using an optimized design, the performance of both diodes was found to be very similar. An example of the calculation results obtained for diodes designed for 30V applications is presented in FIGS. 7A and 7B. In each figure the dashed line represents the performance of a TMBS diode and the solid line represents the performance of a TJBS diode. FIG. 7A shows current as a function of voltage when the device is forward-biased; FIG. 7B shows current as a function of voltage when the device is reverse-biased. As is apparent, the I-V characteristics of the two kinds of devices are very similar.

The TMBS diode may offer the advantage of forming an accumulation layer along the oxidized trench walls when the diode is forward-biased. This can help in lowering the forward voltage drop. However, the MOS gates may not be as efficient in the pinch-off of the mesa regions at reverse bias condition as the PN junctions in the TJBS diode. This allows the channel region in a TJBS diode to be doped to a higher concentration than the channel region in a TMBS diode. Furthermore, using the PN junction around the trenches as a clamping diode in a TJBS device may allow a design of a thinner epitaxial layer than for a TMBS device including a deep P-tub clamping diode. Finally, as is evidenced by FIGS. 7A and 7B, the electrical performance achieved by a TJBS diode can be similar to the performance of a TMBS diode which has been shown to be by far superior to the performance of a planar Schottky diode.

For best performance, the conducting channels of a TJBS diode should have a high aspect ratio $T_C/T_W$ (i.e., the ratio of the depth of the trench to the width of the mesa), and the lateral diffusion of the PN junctions into the mesa region should be minimized. In some embodiments, the aspect ratio is greater than 1.

In designing the dopant profile in the epitaxial layer, one aspect involves whether the PN junction around the trenches is to be used instead of a deep P+-tub as the clamping diode. This preferred embodiment allows an independent design of the doping concentration of the channel region between the trenches to be designed independently of the doping concentration of the "drift" region between the bottom of the trench and the heavily doped substrate. Examples of doping profiles are presented in FIGS. 8, 9 and 10.

Figure 1:
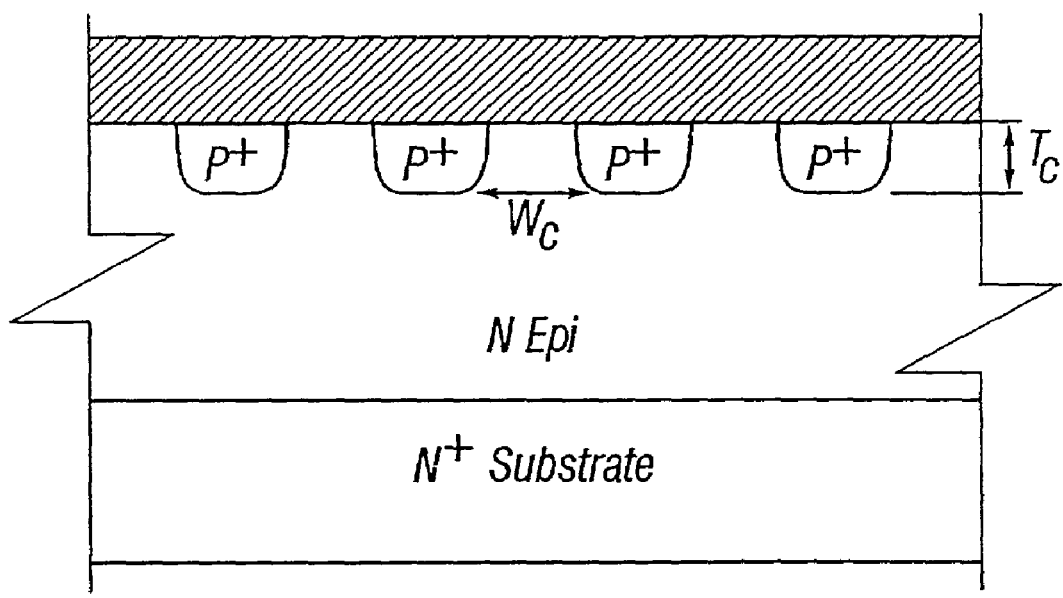
FIG. 1 is a cross-sectional view of a prior art Schottky/PN diode including a grid of PN junctions.
Figure 2:
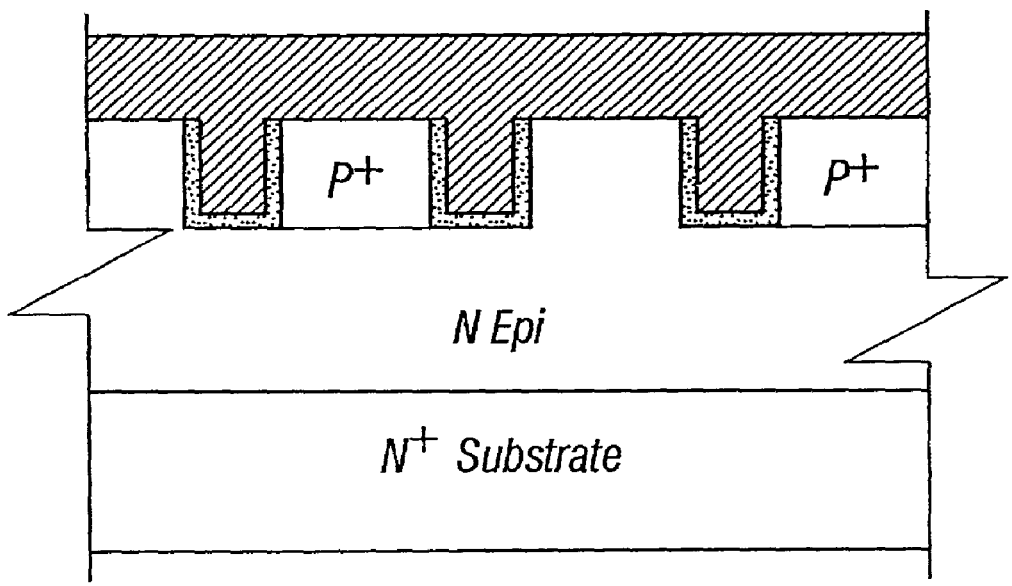
FIG. 2 is a cross-sectional view of a prior art Schottky/PN diode including a grid of PN junctions, wherein the diffusion of the PN junctions is limited by MOS trenches.
Figure 3:
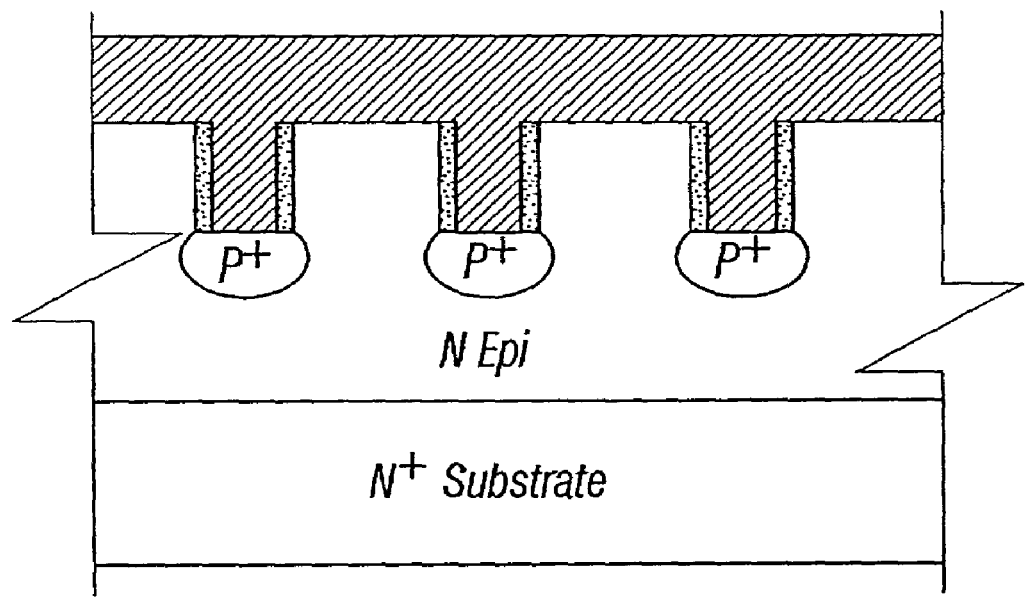
FIG. 3 is a cross-sectional view of a prior art Schottky/PN diode with MOS trenches and PN junctions formed at the bottoms of the trenches.
Figure 4:
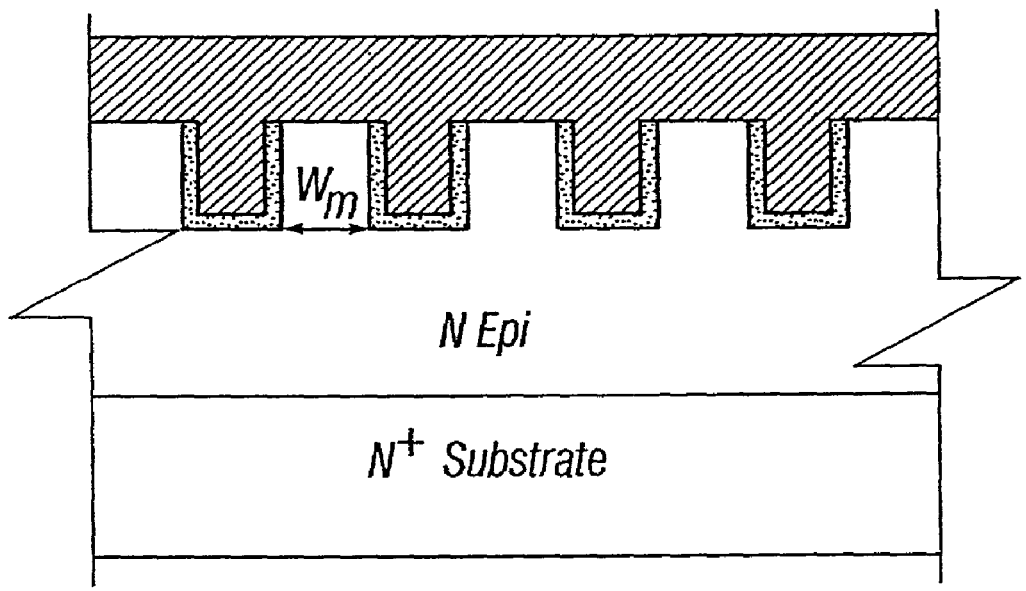
FIG. 4 is a cross-sectional view of a prior art Schottky/PN diode including a grid of MOS trenches.
Figure 5:
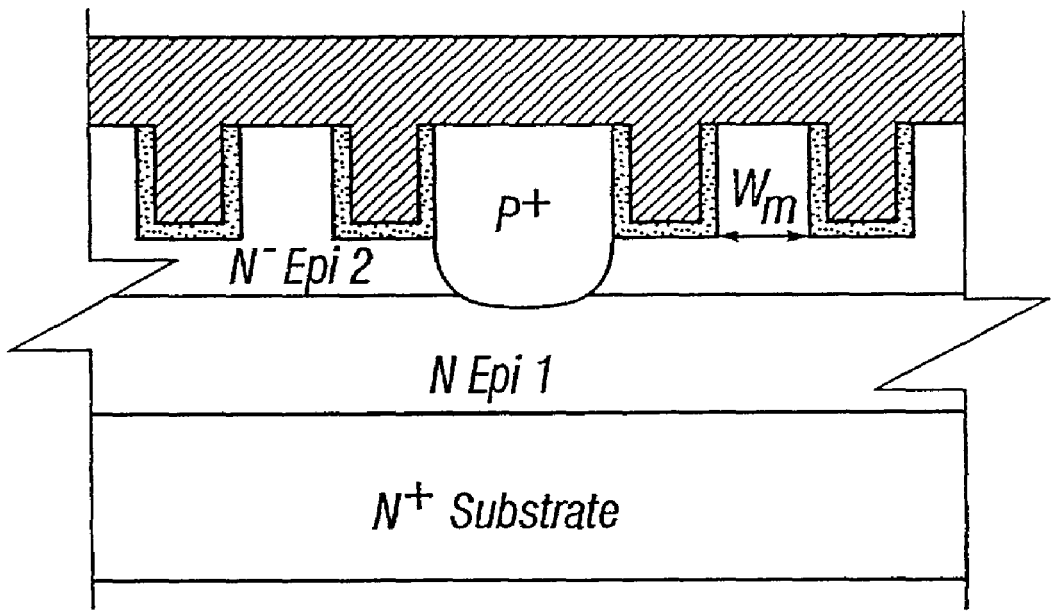
FIG. 5 is a cross-sectional view of a prior art Schottky/PN diode including a grid of MOS trenches and PN clamping diodes.
Figure 8:
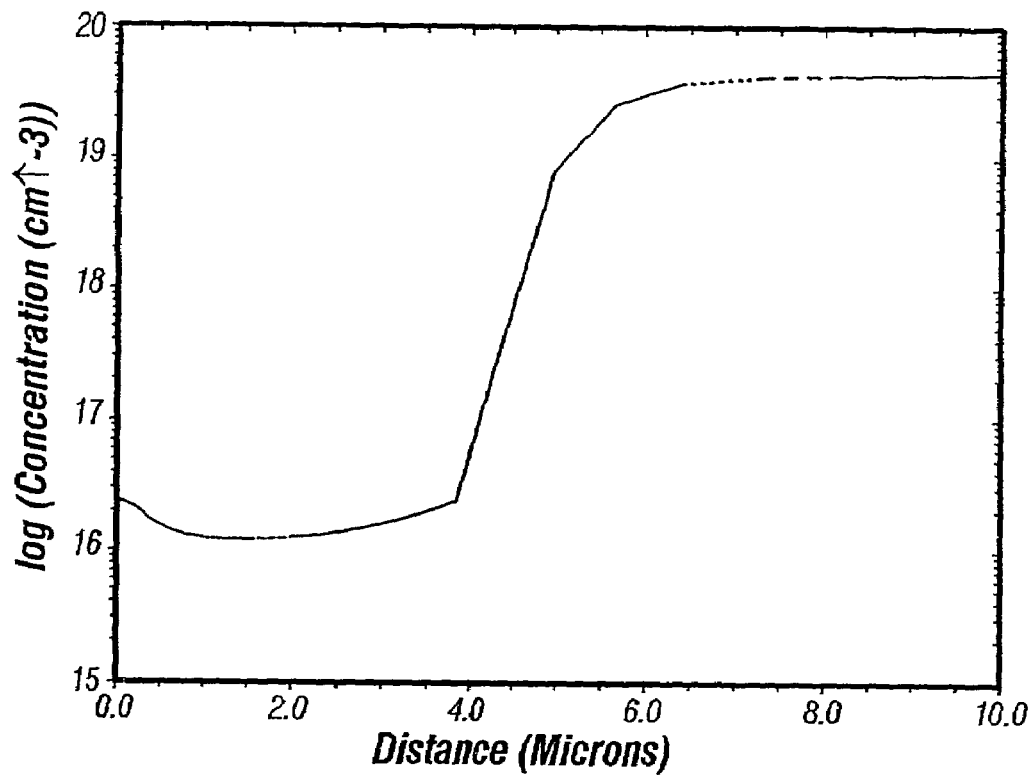
FIGS. 8, 9 and 10 are graphs showing the doping profiles of different embodiments of the invention.
Figure 9:
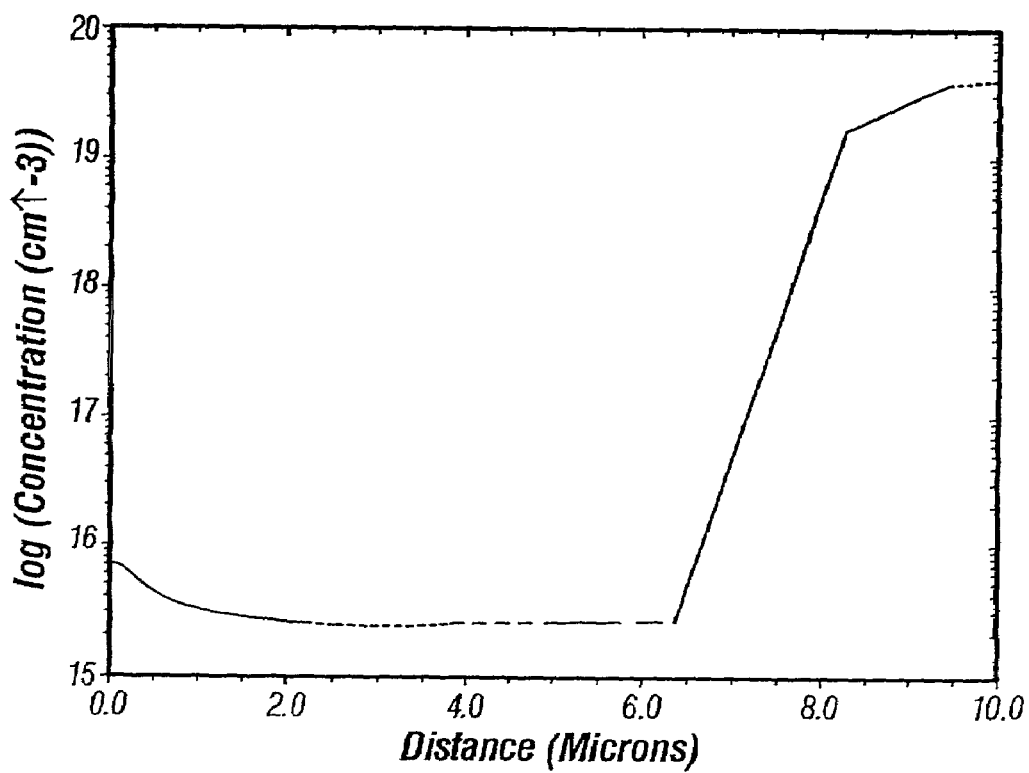

FIG. 8 illustrates a doping profile for a 30V-TJBS-diode, and FIG. 9 illustrates a doping profile for a 90V-TJBS-diode, both diodes being fabricated in silicon. In the case of N-doped epitaxial layers it is difficult to avoid a pile-up of phosphorus at the silicon/oxide-interface. However, designing a TJBS device, the doping concentration in the channel region may be intentionally made higher than in the drift region. This measure can be applied by increasing the dopant concentration of the epitaxial layer in the channel region, or by a channel implant restricted to the active area of the device. The width of the mesa was 1.2 µm in the 30V device of FIG. 8 and 1.5 µm in the 90V-device of FIG. 9. In both cases the trench width was 0.7 µm, and the trench depth 1.5 µm. The trenches were filled with P-doped polysilicon, which also supplied the P-dopant for the diffusion of the PN junction, as described further below.

Figure 10:
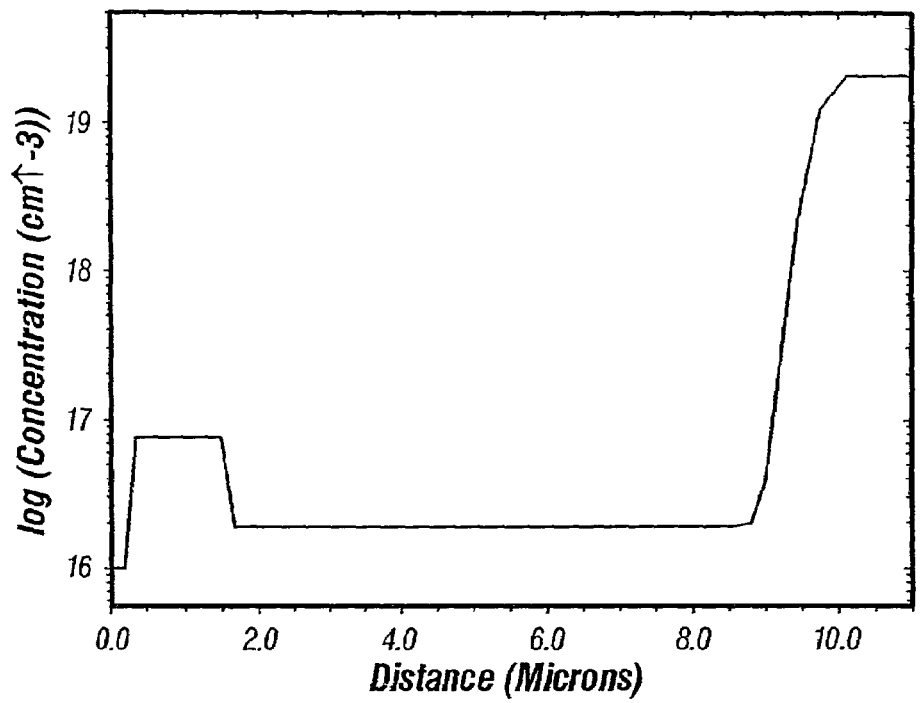

FIG. 10 illustrates a doping profile of a 500V-TJBS-diode fabricated in silicon carbide. In this embodiment, the mesa width, trench width and trench depth were 0.8 µm, 1.0 µm and 2.0 µm, respectively (the aspect ratio was 2.5). Because of the very low diffusivities in silicon carbide, the diffusion effects are practically absent in the SiC-technology and the doping profile within the epitaxial layer can be designed to have a more complex form. The doping profile is not "smeared out" as in the case of a silicon epitaxial layer. In FIG. 10, three resistivity regions have been designed in the epitaxial layer: a lightly-doped drift region to support the high blocking voltage, a relatively heavily-doped the channel region to minimize the serial resistance, and a very low doping at the semiconductor surface to avoid an excessive leakage current at the Schottky interface. As described below, the PN junction around the trench has been made by a tilted implantation, and the trenches are filled with p-doped polysilicon which serves as an electrode of the clamping diode.

Figure 11:
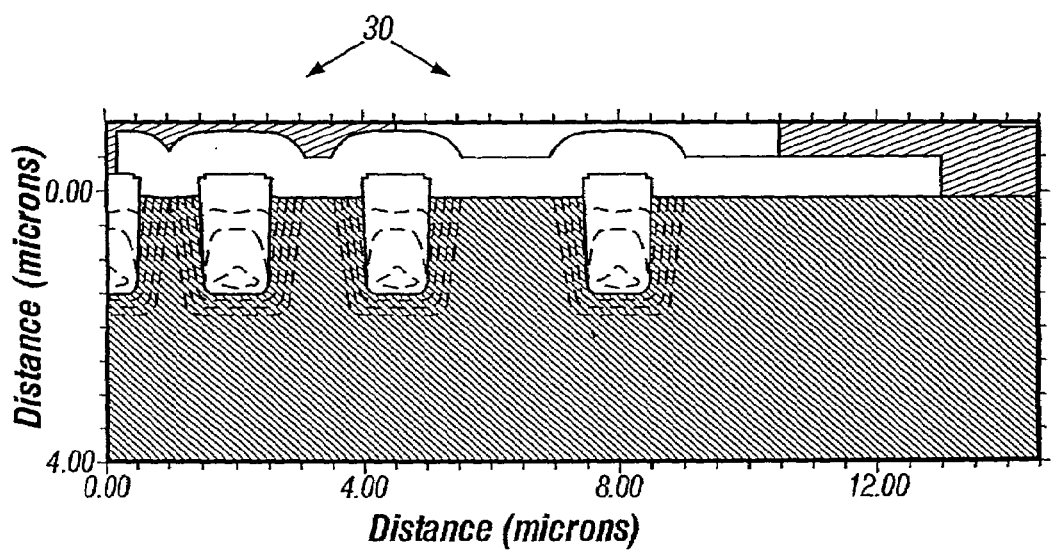
FIG. 11 is a cross-sectional view of a termination region of an embodiment of the invention.

The trenches embedded into PN junctions may be also advantageously used as floating field rings within the edge termination structure of the device. FIG. 11 illustrates field rings 30 which form a field ring structure in the termination region of a 30V-type TJBS-diode, which gives the same breakdown voltage as of the clamping diode within 0.1V.

In fabricating a TJBS diode, it is desirable to find a process which yields a high aspect ratio of the channel (Tc/Wc) and minimizes the area consumed by the lateral diffusion of the PN junction extending from the wall of the trench. Here the silicon and silicon carbide technologies differ significantly. Fabricating a diode in silicon carbide, a local PN junction can be made by implantation only, as the dopant diffusion can be disregarded at temperatures as high as 1600° C. This in turn helps to make a TJBS diode. In contrast, if the TJBS diode is fabricated in silicon, both implantation and diffusion can be used. However, in order to minimize the area that is inaccessible for the Schottky contact, the thermal budget after the introduction of the dopant of the second conductivity type should be kept as low as possible.

Figure 12:
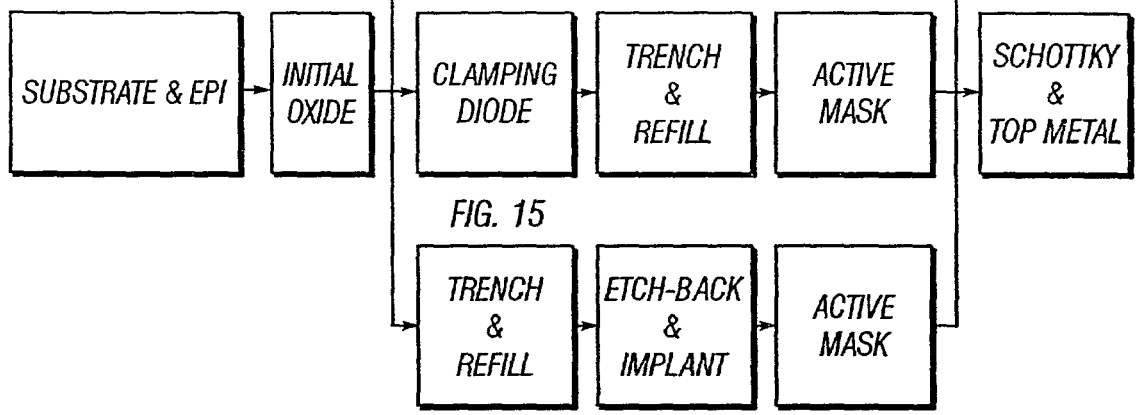
FIG. 12 is a flow chart showing several processes of fabricating a Schottky junction barrier rectifier according to the invention.

FIG. 12 illustrates several process flows for fabricating a TJBS diode. In general the process involves growing an epitaxial layer on a heavily doped substrate and depositing an initial oxide layer. The oxide layer is used as a mask to define the active area of the device, where the Schottky metal will form a contact to the semiconductor body, and as a field oxide in the edge termination area in order to passivate the semiconductor surface. The initial oxidation (or deposition of a CVD oxide) is followed by an interchangeable sequence of patterning the active area of the device and etching trenches into the semiconductor body. The side walls and the bottom of the trenches are doped by implantation or diffusion, forming a PN junction around them, and the material filling the trenches (such as polysilicon) is planarized, leading to an almost flat interface with the top electrode. The PN junction surrounding the trenches will act as a clamping diode. Optionally, an additional deep PN junction may be integrated to perform this function. In the following, the process is described for N-type silicon, but the principles can likewise be applied to P-type silicon and can be easily adapted for silicon carbide.

Figure 13:
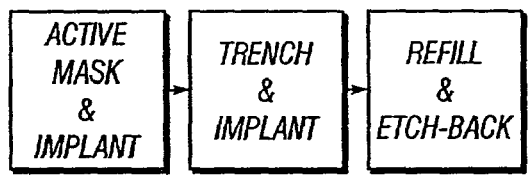
FIG. 13 is a flow chart of the process illustrated in FIGS. 13A–13D.
Figure 15:
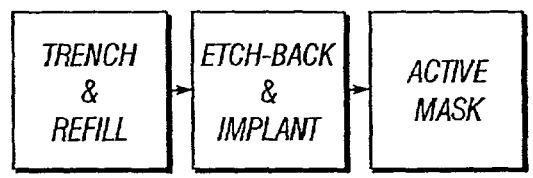
FIG. 15 is a flow chart of the process illustrated in FIGS. 15A–15D.

FIG. 13A illustrates a cross section of the wafer after growth of an N-epitaxial layer 42 on an N+ substrate 40 and a subsequent oxidation to form an oxide layer 44. The substrate 40 is N++, doped with arsenic, antimony or phosphorus to a resistivity as low as 1 to 5 mohm-cm. The phosphorus-doped epi layer 42 having a dopant concentration in the range of $2 \times 10^{15}$ cm$^{-3}$ to $8 \times 10^{16}$ cm$^{-3}$ is grown to a thickness of 2 to 10 µm. After growth of the epi layer 42, the surface is oxidized to a thickness of 0.2 to 1.0 µm using a mix of a dry and steam oxidation at a temperature of 950 to 1100° C. Optionally, this initial oxide layer 44 can be deposited in a CVD process.

The oxide layer 44 is then photomasked with a photoresist layer 46 and etched to define the active area of the device, where the rectifying electrode will form a Schottky contact with the semiconductor. Using the remaining oxide and possibly the photoresist, the active area of the device may be doped to a higher dopant concentration within a region 48 wherein the channels of the diode will be formed. To this end, phosphorus may be implanted with a dose of $10^{11}$ cm$^{-2}$ to $5 \times 10^{12}$ cm$^{-2}$ and energy between 100 and 480 keV. The activation and drive-in of the implant is performed in an oxidizing atmosphere, where an oxide layer with a thickness of 200 to 1000 Å is thermally grown at a temperature of 950 to 1100° C.

The freshly grown oxide layer 50 is then photomasked and etched to define the trench regions, as shown in FIG. 13B. Using the photoresist as a mask, trenches 52 are then etched into the silicon using a reactive ion etcher. The gas composition involves a fluorocarbon and some oxygen. The mix of gases controls the anisotropy of the etching process. The trench is etched to a depth of 1 to 5 µm with a width of 0.4 to 2 µm, and a spacing between trenches (mesa width) of 0.3 to 2 μm, but preferably a depth in the range of 1 to 2 μm with a 0.6 μm width and a 0.8 to 1.5 μm spacing.

Next, boron is implanted into the side walls and the bottom of the trench with a dose of $1\times10^{14}$ cm$^{-2}$ to $2\times10^{15}$ cm$^{-2}$ with an energy below 50 keV, where a tilt of the implant beam by 5 to 15° and a rotation of the wafer should preferentially be applied. Optionally, a boron implant may be substituted by a $BF_2$ implant with a similar dose at an energy below 120 keV. The trench itself is filled with polysilicon 54 in-situ doped with boron to a concentration in the $1\times10^{19}$ cm$^{-3}$ range during the CVD deposition. Polysilicon 54 is deposited to a thickness of 0.3 μm to 1.5 μm, depending of the trench width to be filled in, and then etched back level with the silicon surface, thereby exposing the thin oxide 50 at the silicon surface. After an activation step performed by a rapid thermal process (RTP) at a temperature between 950 and 1050° C. for 10 to 30 seconds, the boron atoms create a P-type layer 56, which surrounds trench 52 like a pocket.

FIG. 13C presents the cross section of the device after a strip of the thin oxide layer 50 by short wet etching in a diluted HF bath, and the final device structure is shown in FIG. 13D after the deposition and patterning of the Schottky metal layer 58. A preferred method of the metallization consists of a sequence of a first metal sputtering (e.g. a layer of Ti 300 Å thick and a layer of TiN 1200 Å thick), followed by a sintering of a silicide (here $TiSi_2$) formed by RTP at 650° C. for 30 seconds, and completed by a deposition (sputtering) of the top metal layer (e.g. aluminum 1.2 μm thick). Different options how to form the Schottky contact locally, not covering the total active area, are discussed in the above-referenced application Ser. No. 08/832,012.

Figure 14:
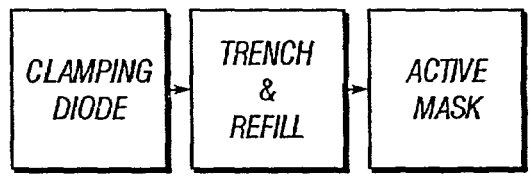
FIG. 14 is a flow chart of the process illustrated in FIGS. 14A–14D.
Figure 14A:
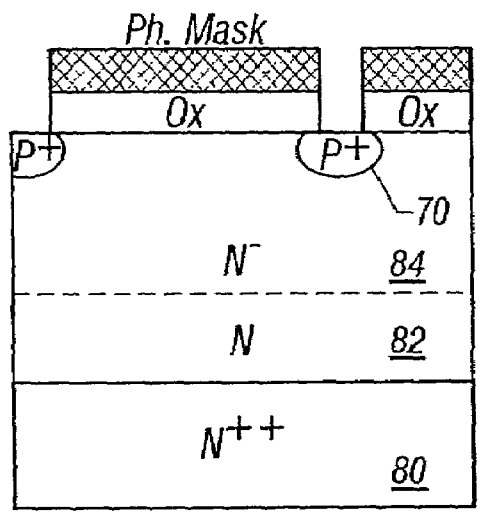
FIGS. 14A–14D are cross-sectional views illustrating a process sequence in which the trenches are filled with a dopant-containing material and the dopant is caused to diffuse from a gate filling material through the sidewalls and bottoms of the trenches.
Figure 14B:
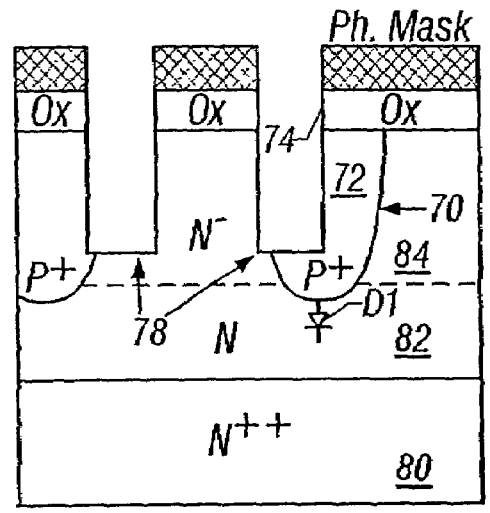

FIGS. 14A–14D describe a sequence wherein a deep P+ tub 70 is formed as a clamping diode D1 and as a guard ring 72 in the edge termination area. The wafer includes an N++ substrate 80 on which stepped epi layers 82 and 84 are grown, layer 82 being doped N and layer 84 being doped N−. For example, for a 30 V diode, layer 82 can be doped to a concentration of $3\times10^{16}$ cm$^{-3}$, and layer 84 can be doped to a concentration of $1\times10^{16}$ cm$^{-3}$. In FIG. 14A, the P+ tub 70 is formed by implanting boron via a photomask at a dose ranging from $2\times10^{14}$ cm$^{-2}$ to $8\times10^{15}$ cm$^{-2}$ and at an energy of 40 to 300 keV. The P+ tub 70 is subsequently driven in by heating at 1000° to 1150° C. for 1 to 8 hrs to a junction depth desired, but preferably deeper than the trench (formed later). In the stepped epitaxy version, the junction should be driven into the underlying higher concentration epi layer 82 (N). An oxide layer 0.1 to 1 μm can be grown during this drive-in and subsequently masked to expose the silicon surface locally for the trench etch process, as shown in FIG. 14B.

Figure 14C:
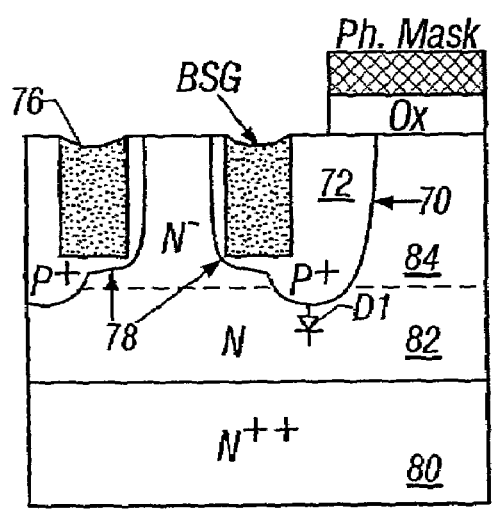

In this embodiment, the trenches are filled with boron-silicate-glass (BSG) 76, which is used as a source for the diffusion of boron atoms into the side walls and the bottom of the trenches 78. The BSG is P-type, having a concentration of 2–3% boron. As shown in FIG. 14C, the active mask is applied after a planarization of the BSG film, and the PN junction around the trench is driven-in in an annealing process at 900° to 1000° C. for 15 to 60 minutes. This annealing step can be replaced by a rapid thermal annealing (RTA) at a temperature of 1050° to 1150° C. for a time of 10 to 30 seconds. The BSG 76 cannot be used as a conducting electrode of a clamping diode, so this variant is preferably used in combination with a deep P-tub diode.

Figure 14D:
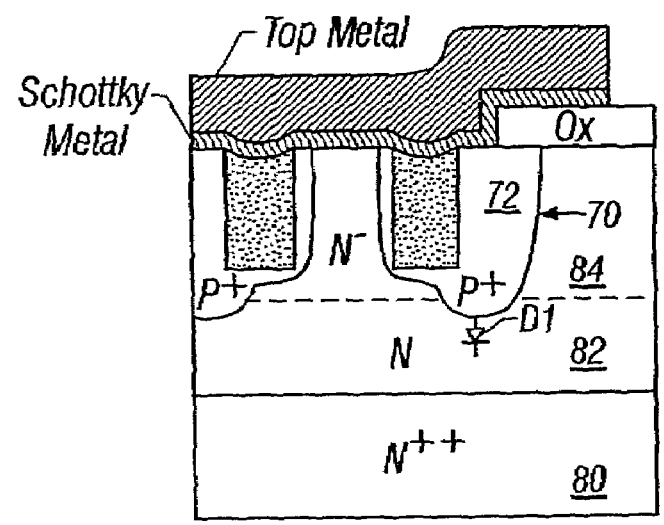

The PN junction around the trench is contacted by the Schottky metal as shown in the FIG. 14D. The deep P-tub can be also used as a guard ring 72 surrounding the active area of the device. This helps in the design of the edge termination of the diode.

Figure 15A:
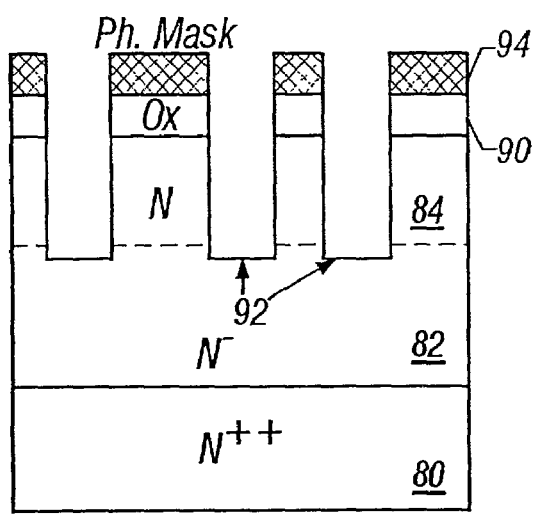
FIGS. 15A–15D are cross-sectional views illustrating a process sequence in which dopant is implanted into a gate filling material and caused to diffuse through the material and through the sidewalls and bottoms of the trenches.
Figure 15B:
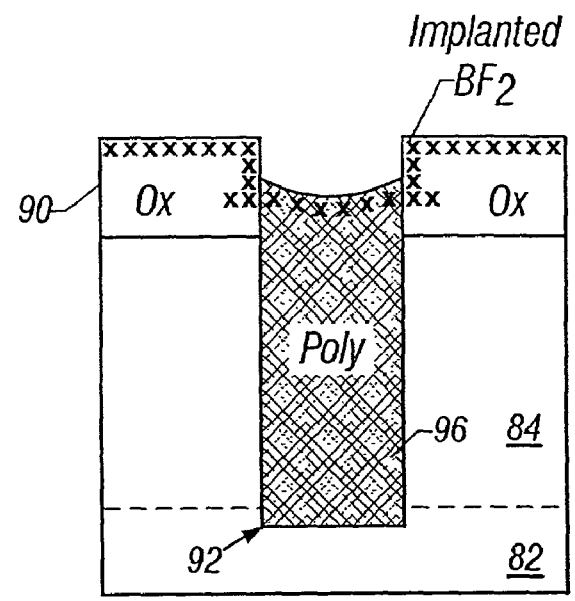
Figure 15C:
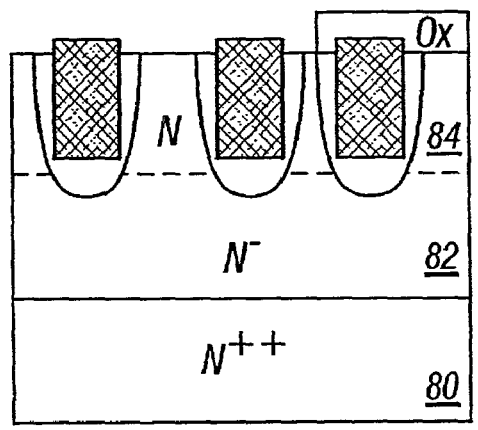

An alternative process flow, shown in FIGS. 15A–15D, leads to a preferred embodiment, where P-type doped polysilicon is used as the source of boron atoms to form the PN junction which acts as the clamping diode. The process begins with N++ substrate 80 and stepped epi layers 82 and 84. As shown in FIG. 15A, the trenches 92 are etched through openings formed in the layer of the thick initial oxide 90. After the removal of the photoresist layer 94, the trenches 92 are filled with polysilicon layer 96 deposited to a thickness approximately 1.5 times larger than the width of the trenches 92. After deposition, the polysilicon layer is removed from the surface of the oxide by a planarizing etch-back. After the etch-back, the surface of polysilicon layer 96 lies between the surface of the oxide layer 90 and the surface of the semiconductor body (in this case epi layer 84), as shown in FIG. 15B. By implanting $BF_2$, at a dose of $5\times10^{14}$ cm$^{-2}$ to $5\times10^{15}$ cm$^{-2}$ and an energy below 120 keV, for example, it is possible to minimize the lateral diffusion of boron atoms laterally into the mesa. To this end, the thermal budget after the polysilicon implantation should be kept very low. In a preferred process, the diffusion of the boron atoms within polysilicon layer 96 and into the side walls and bottoms of the trenches 92 is performed at a temperature ranging from 900° to 1050° C., preferably at 975° C., for a time of 20 to 80 minutes. It is important to use an annealing temperature at which the diffusivity of boron in polysilicon is much larger than the boron diffusivity in monocrystalline silicon. On the other hand, the annealing temperature has to be high enough to activate electrically the implanted atoms.

Figure 15D:
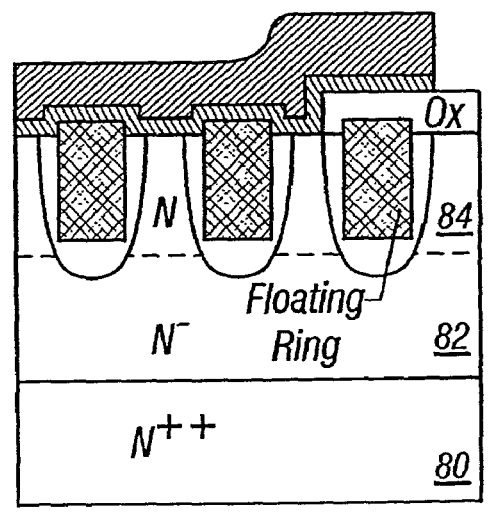

In a preferred process, the anneal is performed in an oxidizing ambient, preferably steam, in order to seal the polysilicon surface with an oxide layer. This step is followed by a mask defining the active area of the device, metallization, and a metal patterning. The manufactured diode may include floating rings as a part of the edge termination, as shown in FIG. 15D.

For a device of opposite conductivity a P-type substrate and epitaxial layer would be used, the region extending along the sidewall of the trench could be doped with phosphorus, and the gate could be polysilicon doped with phosphorus.

Fabricating a Schottky diode for low voltage applications (below 100V) the semiconductor material of choice is silicon. However, it is also possible to provide a Schottky diode for high voltage applications when silicon carbide (SiC) is used as a semiconductor material according to this invention.

This invention may be embodied in many different forms, as will be understood by those skilled in the art, and should not be construed as limited to the embodiments described here. Many variants of the described embodiments can be created by an exchange of singular process steps, device structure components, or variants thereof.

We claim:

1. A process of fabricating a trench junction barrier rectifier comprising:
   providing a semiconductor body of a first conductivity type;
   etching at least two trenches in a surface of the semiconductor body, leaving a mesa between the trenches, each of the trenches having a sidewall and a bottom;
   introducing a dopant of a second conductivity type into a first region of the semiconductor body adjacent the sidewall and the bottom of each of the trenches, leaving a second region of the mesa with a first conductivity type so as to form a PN junction between the first and second regions;

filling the trenches with polysilicon; and depositing a metal layer on a surface of the mesa, wherein introducing the dopant comprises implanting atoms or molecules of the dopant through the sidewall and bottom of the each of the trenches, the dopant being implanted by tilting an implant beam of the dopant to facilitate introducing the atoms or molecules through the sidewall of each of the trenches.

2. The process of claim 1 wherein providing the semiconductor body comprises providing a semiconductor substrate and growing an epitaxial layer on the substrate.

3. The process of claim 1 wherein the dopant comprises boron or phosphorus.

4. The process of claim 3 wherein implanting comprises implanting at a dose of from $1 \times 10^{14}$ cm$^{-2}$ to $2 \times 10^{15}$ cm$^{-2}$.

5. The process of claim 4 wherein implanting comprises implanting boron atoms at an energy less than 50 keV.

6. The process of claim 4 wherein implanting comprises implanting phosphorus atoms or BF$_2$ molecules at an energy less than 120 keV.

7. The process of claim 1 wherein filling the trenches with polysilicon comprises filling the trenches with polysilicon doped with a dopant of the second conductivity type.

8. The process of claim 1 comprising rotating the wafer while implanting atoms or molecules of the dopant through the sidewall and bottom of the each of the trenches.

9. The process of claim 1 wherein tilting an implant beam of the dopant comprises tilting the implant beam of the dopant by 5 to 15 degrees.

10. A process of fabricating a trench junction barrier rectifier comprising:

providing a semiconductor body of a first conductivity type;

etching at least two trenches in a surface of the semiconductor body, leaving a mesa between the trenches, each of the trenches having a sidewall and a bottom;

introducing a dopant of a second conductivity type into a first region of the semiconductor body adjacent the sidewall and bottom of each of the trenches, leaving a second region of the mesa with a first conductivity type so as to form a PN junction between the first and second regions; and depositing a metal layer on a surface of the mesa, wherein introducing the dopant comprises filling each of the trenches with a material containing dopant and causing the dopant to diffuse through the sidewall and the bottom of each of the trenches.

11. The process of claim 10 wherein the material comprises boron-silicate-glass.

12. The process of claim 11 wherein causing the dopant atoms to diffuse comprises heating the semiconductor body to 900° to 1000° C. for 15 to 60 minutes.

13. The process of claim 10 comprising forming a deep tub of the second conductivity type in the semiconductor body and etching at least one of the trenches into the deep tub, the tub being deeper than the at least one trench.

14. The process of claim 13 wherein providing the semiconductor body comprises providing a semiconductor substrate and growing stepped epitaxial layers on the substrate, a first epitaxial layer at a surface of the semiconductor body having a higher doping concentration than a second epitaxial layer beneath the first epitaxial layer.

15. The process of claim 14 wherein forming the deep tub comprises driving dopant of the second conductivity type into the second epitaxial layer.

16. A process of fabricating a trench junction barrier rectifier comprising:

providing a semiconductor body of a first conductivity type;

etching at least two trenches in a surface of the semiconductor body, leaving a mesa between the trenches, each of the trenches having a sidewall and a bottom;

introducing a dopant of a second conductivity type into a first region of the semiconductor body adjacent the sidewall and bottom of each of the trenches, leaving a second region of the mesa with a first conductivity type so as to form a PN junction between the first and second regions; and depositing a metal layer on a surface of the mesa, wherein introducing the dopant comprises filling each of the trenches with a material comprising boron-silicate-glass and containing the dopant and causing the dopant to diffuse through the sidewall and the bottom of each of the trenches, and wherein causing the dopant atoms to diffuse comprises heating the semiconductor body to 1050° to 1150° C. for 10 to 30 seconds.

17. A process of fabricating a trench junction barrier rectifier comprising:

providing a semiconductor body of a first conductivity type;

etching at least two trenches in a surface of the semiconductor body, leaving a mesa between the trenches, each of the trenches having a sidewall and a bottom;

introducing a dopant of a second conductivity type into a first region of the semiconductor body adjacent the sidewall and bottom of each of the trenches, leaving a second region of the mesa with a first conductivity type so as to form a PN junction between the first and second regions; and depositing a metal layer on a surface of the mesa, wherein introducing the dopant comprises:

filling each of the trenches with a material;

implanting a dopant of the second conductivity type into a surface of the material; and heating the semiconductor body, the diffusivity of the dopant in the material being greater than the diffusivity of the dopant in the semiconductor body such that the dopant diffuses through the material and through the sidewall and the bottom of the trenches to form a first region of the second conductivity type extending along the sidewall and bottom of the trenches while leaving the second region of the mesa with the first conductivity type.

18. The process of claim 17 wherein the material comprises polysilicon.

19. The process of claim 18 wherein implanting comprises implanting BF$_2$ at a dose of $5 \times 10^{14}$ cm$^{-2}$ to $5 \times 10^{15}$ cm$^{-2}$ at an energy less than 120 keV.

20. The process of claim 17 wherein the atoms comprises boron.

21. The process of claim 18 comprising;

forming and patterning an oxide mask layer on the surface of the semiconductor body, the oxide mask layer having openings, the trenches being etched through the openings in the oxide mask layer; and filling the trenches with polysilicon to a level above a surface of the oxide mask layer; and planarizing the polysilicon such that a surface of the polysilicon is at a level below the surface of the oxide mask layer and above the surface of the semiconductor body.

22. The process of claim 17 wherein providing the semiconductor body comprises providing a semiconductor substrate and growing stepped epitaxial layers on the substrate, a first epitaxial layer at a surface of the semiconductor body having a higher doping concentration than a second epitaxial layer beneath the first epitaxial layer.

23. The process of claim 22 wherein heating the semiconductor body drives the dopant into the second epitaxial layer.

24. The process of claim 17 wherein heating the semiconductor body is performed in an oxidizing ambient.

* * * * *